United States Patent [19]

Buller et al.

[11] Patent Number: 5,811,334

[45] Date of Patent: Sep. 22, 1998

[54] WAFER CLEANING PROCEDURE USEFUL IN THE MANUFACTURE OF A NON-VOLATILE MEMORY DEVICE

[75] Inventors: James F. Buller; Basab Bandyopadhyay; Shyam Garg; Nipendra J. Patel, all of Austin; Thomas E. Spikes, Jr., Round Rock, all of Tex.

[73] Assignee: Advanced Micro Devices, Inc.

[21] Appl. No.: 578,178

[22] Filed: Dec. 29, 1995

[51] Int. Cl.$^6$ .................................................. H01L 21/8247
[52] U.S. Cl. .......................................... 438/264; 438/906
[58] Field of Search .............................. 437/43, 238, 239, 437/939, 946; 148/DIG. 17; 438/264, 906, 963, 974

[56] References Cited

U.S. PATENT DOCUMENTS

| | | | |
|---|---|---|---|
| 4,958,321 | 9/1990 | Chang | 365/185.28 |
| 5,229,334 | 7/1993 | Kato | 437/946 |
| 5,296,411 | 3/1994 | Gardner et al. | 437/238 |
| 5,328,867 | 7/1994 | Chien et al. | 437/238 |
| 5,516,730 | 5/1996 | Saeed et al. | 437/946 |

*Primary Examiner*—Chandra Chaudhari
*Attorney, Agent, or Firm*—Kevin L. Daffer; Conley, Rose & Tayon

[57] ABSTRACT

A wafer surface cleaning method is provided comprising immersion of the wafer in a $H_2O:NH_4OH:H_2O_2$ solution at a temperature less than 65° C. prior to formation of a thin oxide such as a tunnel oxide or gate oxide. Immersion of the wafer in a sub-65° C. $NH_4OH$ results in a smoother wafer surface that increase the charge-to-breakdown ($Q_{BD}$) of the subsequently formed oxide. In the tunnel oxide embodiment, the lower temperature solution also reduces the oxide etch rate of the solution enabling a minimum overgrowth of gate oxide which, in turn, enables the addition of an in situ growth temperature anneal of the gate oxide without altering other process parameters.

11 Claims, 6 Drawing Sheets

WAFER CLEANING PROCEDURE USEFUL IN THE MANUFACTURE OF A NON-VOLATILE MEMORY DEVICE

BACKGROUND OF THE INVENTION

1. Field of the Invention

This invention relates to the field of metal oxide semiconductor (MOS) fabrication and more particularly to a method of cleaning an MOS wafer prior to oxide formation, the method resulting in an MOS device such as an MOS non-volatile memory device having an oxide of improved endurance.

2. Description of the Relevant Art

In semiconductor wafer processing, even trace amounts of foreign particles and other contaminants can dramatically reduce the number of functional devices per wafer, commonly referred to as the process yield. To minimize the level of contamination and maximize yield, semiconductor processes employ numerous cleaning procedures. One such cleaning procedure, commonly referred to as an "RCA clean", is widely used within the semiconductor industry to clean silicon and silicon dioxide ("oxide") prior to high temperature operations such as thermal oxidation. In their various forms, RCA cleans generally consist of a first step, designed to remove organic contaminants, such as residual photoresist, and a second step, which removes trace metal particles and ionic contaminants. The first step generally comprises immersing the wafer in a 75°–85° C. solution of $H_2O$—$NH_4OH$—$H_2O_2$ while the second step generally comprises immersing the wafer in a 75°–85° C. solution of $H_2O$—$HCl$—$H_2O_2$.

The removal of residual organic contaminants from the wafer surface during an RCA clean is commonly accomplished by immersing the wafer in a 75°–85° C. solution of water ($H_2O$), ammonium hydroxide ($NH_4OH$), and hydrogen peroxide($H_2O_2$). $H_2O_2$ decomposes rapidly above 80° leaving a solution of $NH_4OH$ and water that can etch the silicon surface rapidly. In processes that utilize a solution heated to greater than 80° C., the $H_2O_2$ must be carefully monitored and replenished to prevent depletion and the silicon etch associated therewith.

Subject to the $H_2O_2$ depletion constraint, it has been considered generally desirable to use higher temperature $H_2O$—$NH_4OH$—$H_2O_2$ solutions because the oxide etch rate increases with temperature thereby increasing the efficiency of the clean. Higher etch rates result in a more efficient and expedient clean because contaminants can be undercut or dislodged from the surface in less time. This consideration has predominated the industry's approach to RCA cleans and has resulted in a strong preference for higher temperature solutions.

Despite the tendency of the prior art towards higher temperature wafer cleaning solutions, RCA cleaning in the 75°–85° C. range tends to roughen the silicon substrate surface. Oxides subsequently formed on a rough silicon surface are generally of a lower quality than oxides grown under identical conditions on a smoother silicon surface. It is believed that the enhanced etch rate attacks the silicon substrate along, e.g., localized lattice dislocation areas. Localized areas of pitting may therefore occur at the silicon surface which then translate to localized regions of oxide thinning.

In the manufacturing of EEPROM or flash memories utilizing tunnel oxide structures for example, conventional processes subject the gate oxide and silicon surfaces to RCA cleans at 75° C. or above prior to the tunnel oxidation step. A typical prior art tunnel oxide process contains the following process sequence: 1) the gate oxide is grown; 2) optional threshold adjustment processing steps are performed; 3) organic photoresist is deposited directly onto the gate oxide; 4) the tunnel oxide mask is patterned to define tunnel oxide windows where the tunnel oxide will ultimately be located; 5) the wafer is oxide etched to remove the oxide within the tunnel oxide windows; 6) the tunnel oxide mask photoresist is stripped; 7) an RCA clean is performed; and 8) the tunnel oxide is grown in an oxidation tube. To compensate for the significant amount of gate oxide that is etched backed during the 75°–85° C. $NH_4OH$ solution dip performed during the pre-tunnel oxidation RCA clean, the gate oxidation cycle time must be increased. The longer cycle time results in a thicker gate oxide that is etched back to process specification during the subsequent clean.

The additional cycle time required to overgrow the gate oxide in the prior art processes necessarily consumes a valuable portion of the process thermal budget. Process thermal budget refers to a time and temperature restraint imposed on post-implantation processing. Achieving a desired doping profile requires strict control over the amount of time during which the wafer is exposed to high temperature (i.e. >800° C.) processing after the channel stop, source/drain, and threshold adjust implants.

SUMMARY OF THE INVENTION

The problems outlined above are in large part solved by an improved clean technique. The improved clean sequence utilizes an $H_2O$—$NH_4OH$—$H_2O_2$ solution at a temperature less than or equal to 65° C. The present process can be utilized either in the formation of an MOS device or an MOS non-volatile memory device. The lower temperature $H_2O$—$NH_4OH$—$H_2O_2$ solution results in a silicon surface that is smoother than the surface left behind by a conventional RCA clean at 75°–85° C. Using the improved clean, elevational disparities in the silicon surface are reduced by approximately 50% over conventional RCA clean methods. As described in the accompanying detailed description and drawings, quantitative analysis of large area dielectric structures has demonstrated that both charge-to-breakdown ($Q_{BD}$) and voltage ramped dielectric breakdown ($V_{RBD}$) improve significantly for oxides formed over the smoother silicon surface achieved with the improved clean technique. The smoother silicon surface achieved with the improved clean is beneficial whether implemented in general purpose MOS processes prior to the formation of the gate oxide or in a tunnel oxide process just prior to the formation of the tunnel oxide. In addition, when used in conjunction with a non-volatile memory process employing tunnel oxide structures, the significantly lower oxide etch rate of the improved clean eliminates the need to overgrow the gate oxide and, as a consequence, permits the addition of an in situ growth temperature anneal cycle to the gate oxide cycle without requiring any implant adjustments. Because the time-temperature product of the anneal cycle permitted by the improved clean is equivalent to the time-temperature product of the overgrowth portion of the gate oxide cycle of conventional processes, the doping profile achieved using the improved clean is the same as the doping profile used with conventional cleans. Post oxidation annealing can be used to improve oxide quality by decreasing the densities of the $Si/SiO_2$ interface trapped charge ($Q_{it}$) and the bulk oxide trapped charge ($Q_{ot}$). Thus, without altering any implants and without requiring any additional processing, eliminating the need to overgrow the gate oxide and implementing a post oxidation anneal would improve the quality of the gate oxide.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
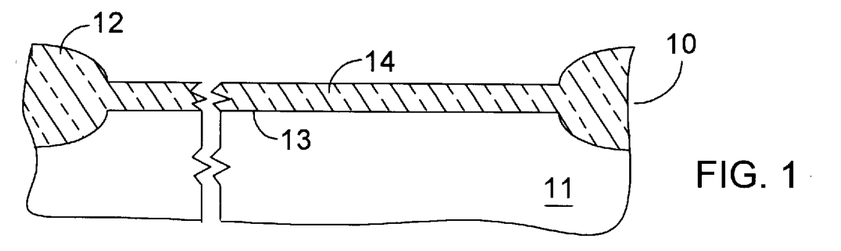
FIG. 1 is a partial cross-sectional view of a semiconductor wafer shown after growth of an oxide.
Figure 2:
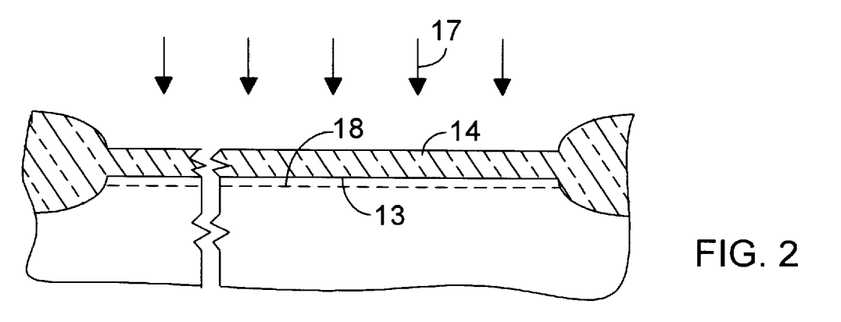
FIG. 2 is the semiconductor wafer of FIG. 1 having threshold adjust ions implanted through the oxide.
Figure 3:
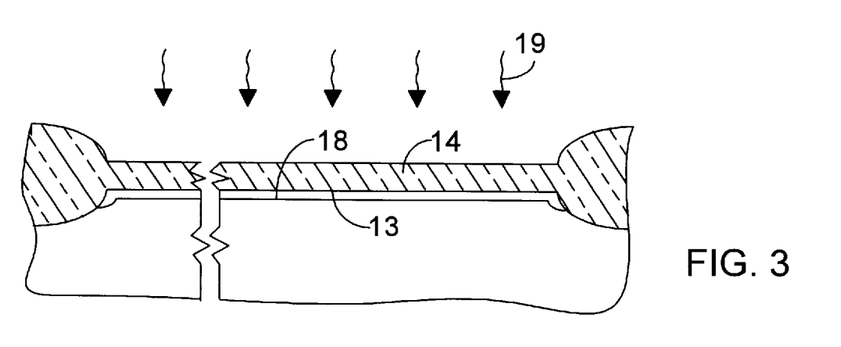
FIG. 3 is the semiconductor wafer of FIG. 2 subsequent to an anneal step.
Figure 9:
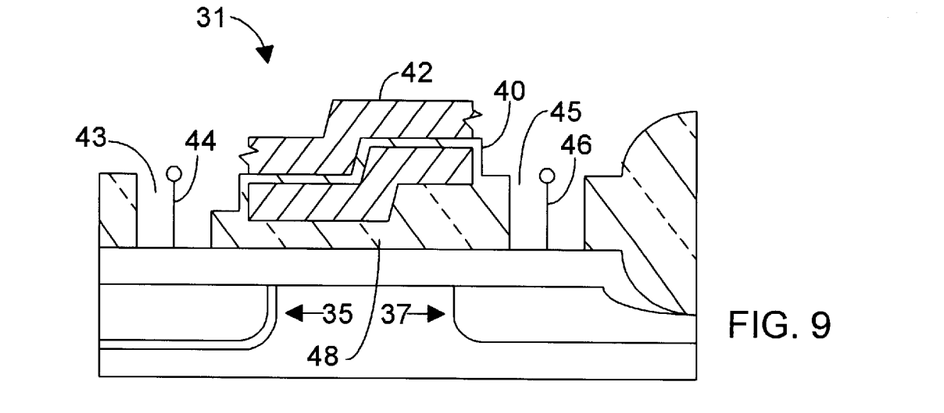
FIG. 9 is the area "A" showing a non-volatile memory device formed in a step subsequent to FIG. 8.
Figure 10:
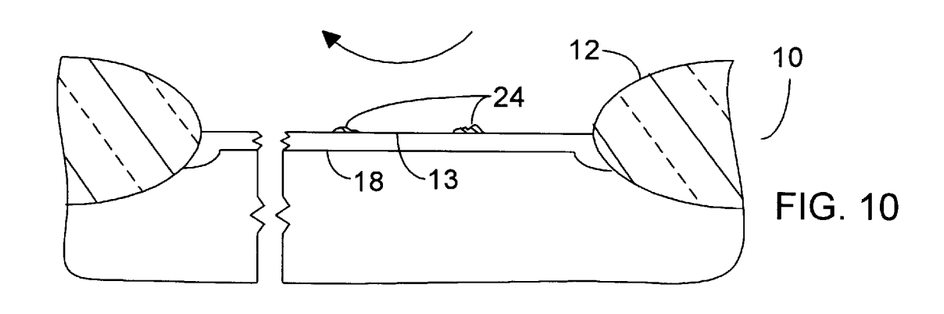
FIG. 10 is the semiconductor wafer of FIG. 3 having oxide blanket removed according to an exemplary embodiment.
Figure 11:
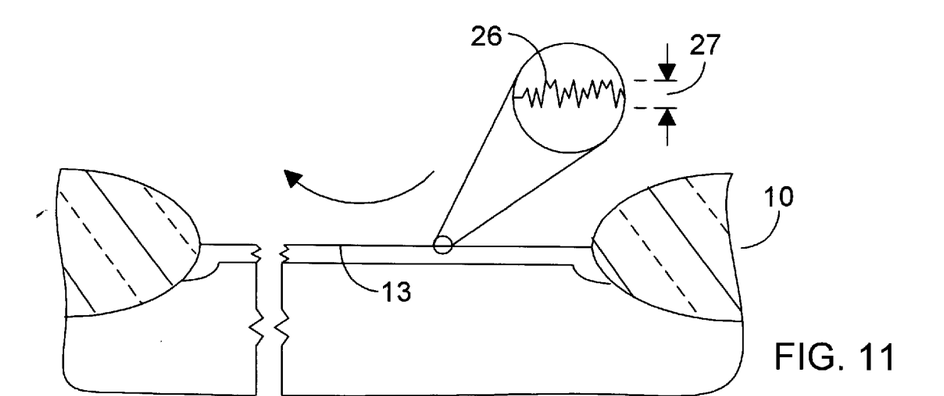
FIG. 11 is an exploded view, after the present cleaning sequence and subsequent to FIG. 10, showing elevational disparity of the silicon surface prior to the formation of oxide.
Figure 12:
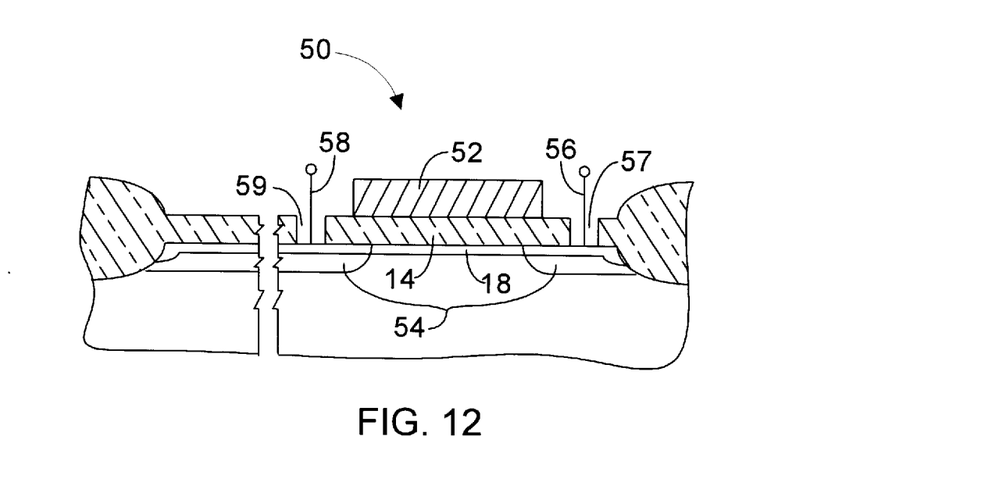
FIG. 12 is a cross section of an MOS transistor.

Turning now to the drawings, FIGS. 1–3 are common to both the embodiment of the invention specific to tunnel oxide devices (FIGS. 4–9) and the embodiment of the invention directed more generally towards an improved method of preparing a silicon surface prior to the formation of the gate oxide in an MOS process (FIGS. 10–12). FIG. 1 is a cross section of wafer 10, comprised of substrate 11 and wafer upper surface 13, in the early stages of MOS fabrication, after the formation of field oxide 12 and thin oxide 14 on silicon substrate 11. Field oxide 12 is used to electrically isolate individual devices or transistors from each other. In a first embodiment of the invention, thin oxide 14 is a sacrificial oxide designed to consume $NH_3$ formed at wafer upper surface 13 during the growth of field oxide 12. Sacrificial oxides are common to MOS processes that utilize oxide isolation structures and typically range from 150 to 500 angstroms. In an embodiment of the invention directed towards non-volatile memories (NVM) devices and more specifically towards NVM utilizing tunnel oxide structures, thin oxide 14 represents the gate oxide. Gate oxides are well known in the art and typically range from 50 to 300 angstroms in thickness.

FIG. 2 depicts a conventional threshold adjustment implant during which impurity layer 18 is introduced into substrate 11. Suitably, a boron implant 17 is used to form impurity layer 18 in a p-type MOS device. After threshold adjustment implantation, an anneal is performed, as represented in FIG. 3, to restore silicon substrate 11 to its pre-implanted condition and to electrically activate the impurities in impurity layer 18. Anneal is carried forth by applying, e.g., 800°–900° C. temperature cycle, denoted as numeral 19, to wafer 10.

With respect to the tunnel oxide embodiment, prior art processes typically form gate oxide 14 with a thickness 30 to 40 angstroms in excess of the process specification. The excess oxide is then etched back during the second step of a cleaning sequence prior to tunnel oxidation. Because the oxide etch rate of the $H_2O:H_2O_2:NH_4OH$ solution decreases dramatically with decreasing temperature, reducing the first RCA clean temperature (i.e., reduce the temperature of the $H_2O:H_2O_2:NH_4OH$ solution to less than 65° C.) eliminates the need to significantly overgrow the gate oxide. Needing less oxide growth, the gate oxidation cycle is shortened permitting the introduction of an anneal cycle, wherein the anneal cycle is incorporated into the process sequence following the oxidation cycle.

In the preferred embodiment, the anneal is performed by purging the oxidation tube of oxygen, keeping the temperature constant, and introducing $H_2$ or an inert ambient such as $N_2$ or Ar. Substituting the oxide overgrowth required to compensate for the high etch rate of the 75° C. $NH_4OH$ solution with the anneal cycle of the lower temperature process results in a gate oxide having the same thickness but with improved quality. In addition, because the time-temperature product of the oxidation cycle remains the same, the present method results in the same doping profile as the prior art process and no modifications of implant dosages is required. Thus, the improved gate oxide is achieved with a minimal impact on manufacturing.

Figure 4:
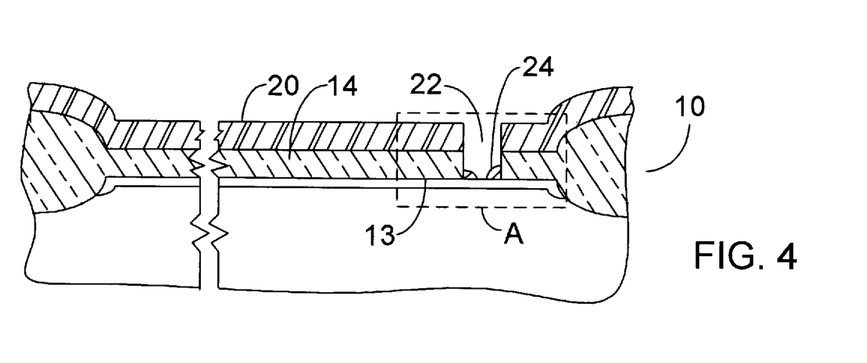
FIG. 4 is the semiconductor wafer of FIG. 3 having a select region of oxide removed, according to an exemplary embodiment.
Figure 5:
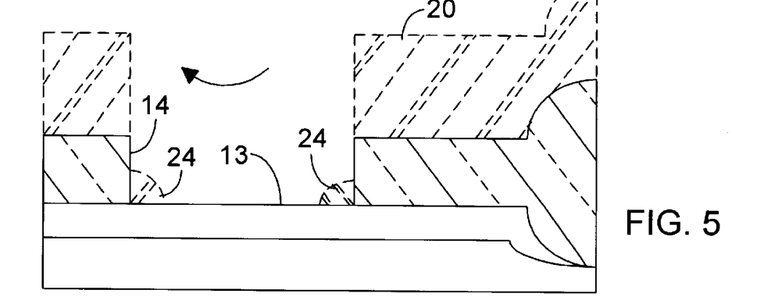
FIG. 5 is a exploded view of area "A" in FIG. 4.

FIGS. 4–9 are specific to an embodiment which utilizes tunnel oxide structures such as flash memories and EEPROMs. FIG. 4 portrays a cross section of wafer 10 just prior to the tunnel oxide clean sequence. Organic photoresist layer 20 is deposited directly onto gate oxide 14, patterned with a masking step to define tunnel oxide window 22, exposed, and developed. Wafer 10 is then oxide etched to remove gate oxide 14 within tunnel oxide window 22. FIG. 5 is an exploded view of tunnel oxide window 22 after strip of photoresist layer 20. FIG. 5 portrays organic and/or inorganic contaminants 24 which remain after photoresist strip. Residual contaminants 24, however, are shown removed in a subsequent clean cycle in close proximity to gate oxide 14 and wafer upper surface 13.

Wafer 10 and residual contaminants 24 are subjected to a cleaning step hereof. In the preferred embodiment, wafer 10 is pre-cleaned in a $H_2SO_4$—$H_2O_2$ mixture and rinsed using deionized and filtered water at room temperature. Wafer 10 is then immersed in a solution of $H_2O$—$NH_4OH$—$H_2O_2$ in the ratio of approximately 5:1:1 by volume for about 5–15 minutes at 65° C. or less. Wafer 10 is thereafter rinsed in a solution of deionized water for approximately one minute. Wafer 10 is then immediately immersed in a solution of $H_2O$—$HCl$—$H_2O_2$ suitably at 85° C. and in the ratio of 6:1:1 by volume for 5–15 minutes. The HCl clean is followed by a rinse in deionized water and a drying step in a rinser/dryer employing deionized water to rinse and heated $N_2$ to dry. Dryers of this description are known in the art.

Figure 6:
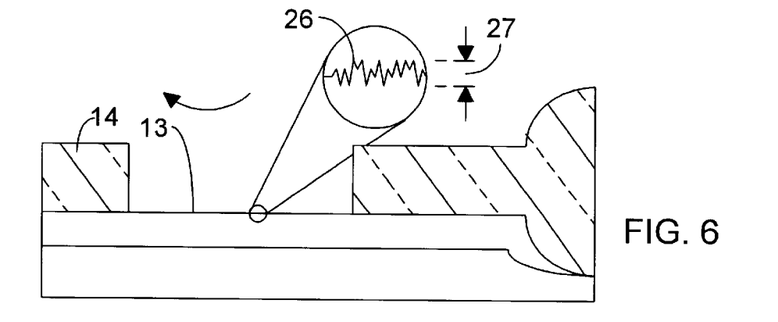
FIG. 6 is a further exploded view along area "A" of FIG. 4 after the present cleaning sequence, showing elevational disparity of the silicon surface prior to the formation of an oxide.

FIG. 6 shows wafer 10 after the cleaning steps have occurred, with an exploded view revealing elevational disparities 26. As discussed above, it is desirable to minimize elevational disparity distance 27 to improve the quality of the oxide subsequently formed on wafer upper surface 13. The sub-65° C. clean step employing a solution of $H_2O$—$NH_4OH$—$H_2O_2$ minimizes these disparities and generally results in a smoother wafer surface and a higher $Q_{BD}$. Using a lower temperature solution, it is theorized that elevational disparities 27 are reduced by 50% and that the improved smoothness of the wafer surface correlates to an improved $Q_{BD}$.

Figure 13:
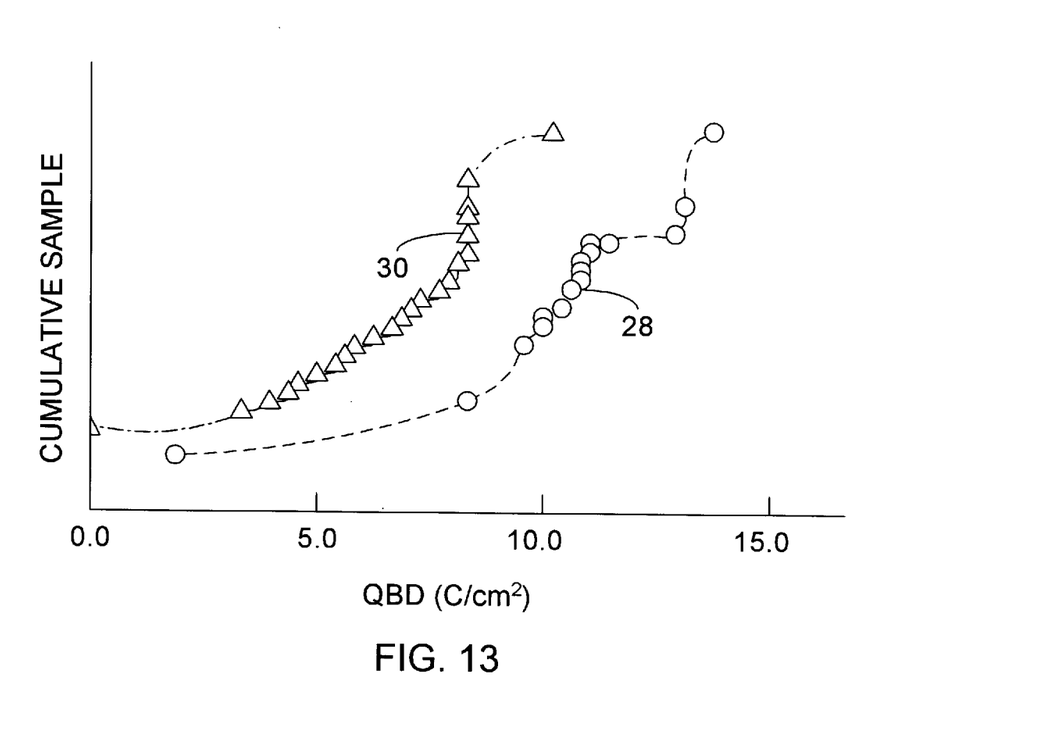
FIG. 13 is a graph showing the charge-to-breakdown, $Q_{BD}$, of large area dielectric structures for a lower temperature and a higher temperature RCA clean process.

FIG. 13 shows results from a quantitative comparison of the $Q_{BD}$ for a large area tunnel oxide structure residing in a p-well area. For purposes of this experiment, $Q_{BD}$ was measured by forcing a current through the tunnel oxide, measuring the voltage across the oxide, and recording the time at which the voltage drops, in absolute value, below a predetermined threshold. The total charge-to-breakdown can then be calculated by simply multiplying the forced current by the time to breakdown and dividing by the area of the structure. Data line 30 represents data obtained using conventional 85° C. $NH_4OH$ solution clean prior to gate oxidation. As shown on the graph, the median value $Q_{BD\ of\ the}$ 85° C. process is approximately 8 $C/cm^2$ while the 65° C. process hereof resulted in a median value of approximately 11 $C/cm^2$. Thus, the 65° C. process demonstrates a median value improvement of approximately 37%. Inspection of silicon surface 11 just prior to tunnel oxidation shows that the lower temperature clean results in a smoother silicon surface, as noted above, and it is postulated that the resulting improvement in $Q_{BD}$ is attributable to this effect.

Figure 7:
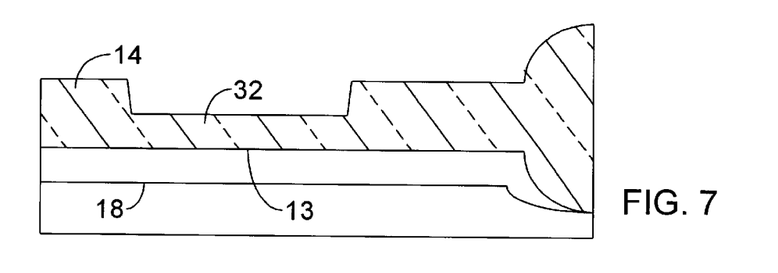
FIG. 7 is the area "A" showing a tunnel oxide formed in a step subsequent to FIG. 6.
Figure 8:
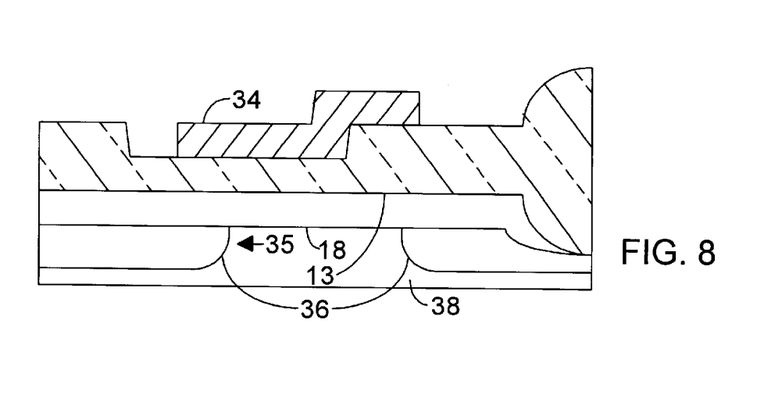
FIG. 8 is the area "A" showing a floating gate and source and drain regions formed in a step subsequent to FIG. 7.

FIG. 7 is a cross section of the wafer after formation of tunnel oxide 32. As seen in Fig. 7, tunnel oxide 32 is thinner than the gate oxide 14. The thickness of typical tunnel oxides range from 70 to 100 angstroms. In a preferred embodiment, formation of tunnel oxide 32 and gate oxide 14 is carried out separately in an oxidation tube at a temperature of approximately 800°–950° C. FIG. 8 is a cross section of a tunnel oxide device implemented in a single poly process after formation of floating gate 34 and source/drain regions 36. Floating gates are well known in the field of flash memories and EEPROMs and are so named because they are not physically connected to other circuitry. In the preferred embodiment, floating gate 34 is comprised of heavily doped polycrystalline silicon formed in a chemical vapor deposition reactor. Doping of the poly can be alternatively accomplished either in situ during deposition or by ion implantation. After floating gate 34 has been formed, source/drain regions 36 are fabricated using an ion implantation step. In the single poly embodiment of a EEPROM memory device, the device's control gate is implemented through a contact (not shown in the figure) to the silicon substrate 38.

FIG. 9 shows a completed flash memory cell 39 implemented in a double poly process. Inter gate dielectric 40 is formed prior to formation of poly control gate 42. After formation of control gate 42, source contact window 43 and drain contact window are opened such that source region 35 can be contacted by source contact 44 and drain region 37 can be contacted by drain contact 46. The dual-thickness floating gate dielectric 48 is described in reference to U.S. Pat. No. 4,958,321. Although the multi-thickness dielectric embodiment of a flash memory cell is specifically disclosed herein, it is to be understood that the method of cleaning the silicon substrate surface is applicable in any process sequence comprising the formation of an oxide on a silicon substrate, and more specifically in any tunnel oxide process sequence wherein organic photoresist is deposited directly onto a gate oxide structure prior to the opening of a tunnel oxide window and the formation of a tunnel oxide.

Turning now to FIGS. 10–12, the method of removing contaminants from a silicon surface employing an MOS transistor is one which is shown. The MOS transistor is common in the formation of MOS logic and RAM devices, and need not be unique to a non-volatile memory. FIGS. 10–12 are a continuation of the process sequence of FIGS. 1–3 for a generalized MOS embodiment of the cleaning sequence hereof. FIG. 10 shows contaminants 24 on wafer upper surface 13 prior to the two step clean cycles followed by gate oxide formation. FIG. 11 shows wafer upper surface 13 after both clean steps are concluded. The exploded view of wafer upper surface 13 reveals elevational disparities 26. Using the lower temperature $H_2O$—$NH_4OH$—$H_2O_2$ solution disclosed above, maximum elevation disparity 27 is minimized and subsequently formed oxides will evidence higher $Q_{BD}$. For example, a gate oxide 14 is formed, absent localized thinning, upon surface 13 by utilizing a subsequent thermal oxidation step. FIG. 12 displays fully formed MOS transistor 50 comprised of polysilicon gate 52, source/drain areas 54, gate oxide 14, source contact window 59, source contact 58, drain contact window 57, and drain contact 56.

Figure 14:
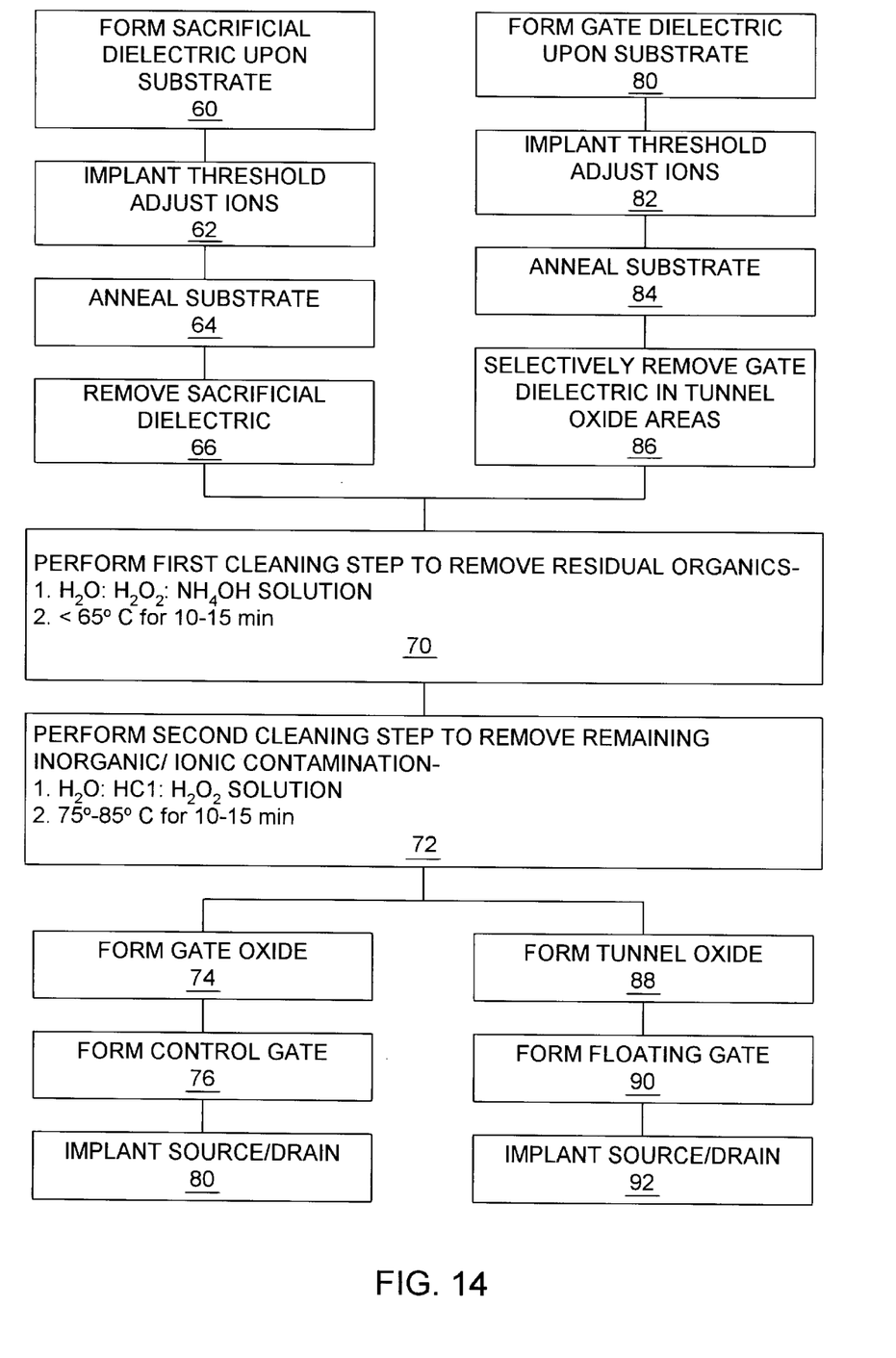
FIG. 14 is a flow diagram of alternate process embodiments of the present methodology wherein the right hand branch is the flow diagram for a preferred embodiment employing a single poly non-volatile device.

FIG. 14 shows the processing sequence for the alternative embodiments of the cleaning method disclosed herein. The left side column discloses process steps for the generalized MOS pre-gate oxide sequence while the right side column discloses process steps specific to the tunnel oxide process. As seen in FIG. 14, the wafer cleaning procedure is common to the alternative embodiments. In one case, the improved clean being performed prior to gate oxidation, and in the second case, the improved process being performed prior to tunnel oxidation.

Referring specifically to the generalized MOS processing sequence disclosed on the left side of FIG. 14, the sequence begins with step 60, the formation of a sacrificial dielectric upon the silicon substrate. Next, step 62, the threshold adjust implant is performed. Following threshold adjustment, the substrate is annealed as indicated in 64. The sacrificial oxide is then removed according to step 66. After removal of the sacrificial oxide, the wafer is ready for the improved cleaning procedure hereof. In step 70, the wafer is immersed in the $H_2O:NH_4OH:H_2O_2$ solution at 65° C. or less for 5–15 minutes. After a rinsing step, the second cleaning step 72 is performed by dipping the wafers in an $H_2O:HCl:H_2O_2$ solution at 75°–85° C. for 5–15 minutes. Steps 74, 76, and 78 shown in FIG. 14 refer to the formation of gate oxide, formation of a control gate, and the formation of source/drain regions respectively.

Figure 15:
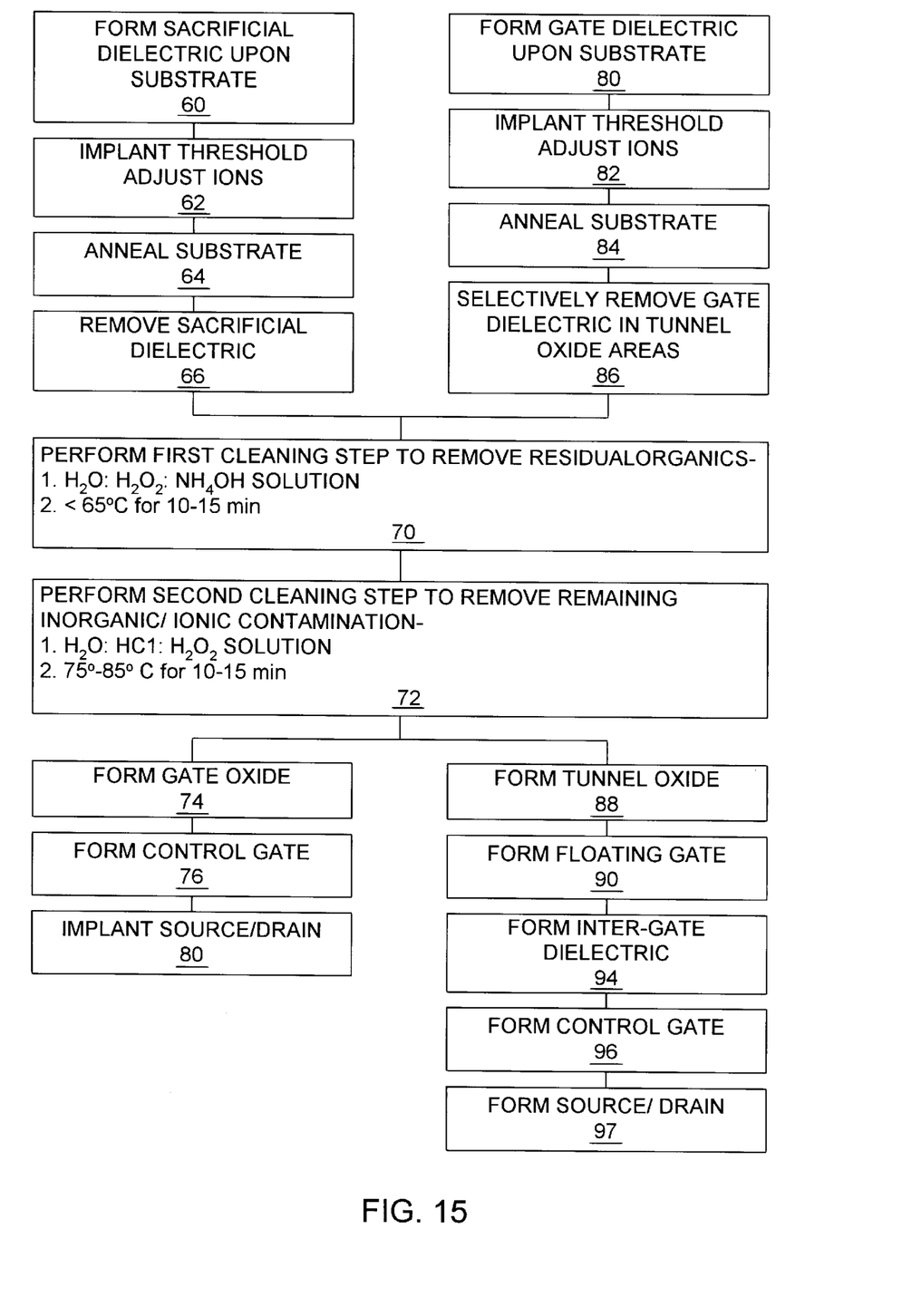
FIG. 15 is a flow diagram of alternate process embodiments of the present methodology wherein the right hand branch is the flow diagram for a double poly non-volatile device.

Referring now to the right hand side of FIG. 14, which depicts a process sequence for the formation of a single poly non-volatile memory employing the improved cleaning procedure hereof. The sequence is begun with step 80, encompassing the formation of a gate dielectric upon the silicon substrate. Step 80 is followed by a threshold adjustment implant shown by step 82. The substrate is then annealed during step 84. After anneal, step 86 is performed, in which the wafer is patterned and the gate oxide selectively etched in those areas where tunnel oxide will be located. After the etch and photoresist strip in step 86, the improved cleaning sequence described above as steps 70 and 72 is performed. Subsequent to the improved cleaning sequence, a tunnel oxide is formed in step 88, a floating gate formed in step 90 and source/drain regions defined in step 92. In a double poly process sequence, shown in FIG. 15, a tunnel oxide is formed in step 88, a floating gate formed in step 90, an intergate dielectric formed in step 94, a poly control gate formed in step 96 and source/drain regions defined in step 97.

It would be appreciated to those skilled in the art to having the benefit of this disclosure that this invention is believed to be capable of use with any MOS circuit employing a gate and/or tunnel oxide. Furthermore, it is also to be understood that the form of the invention shown and described is to be taken merely as presently preferred examples of how a semiconductor wafer cleaning procedure can be improved to achieve a smoother silicon substrate surface prior to a thermal oxidation step. Variations in the particular processes that employ the cleaning procedure hereof may not affect the benefits achieved using the procedure. It is intended that the following claims be interpreted to embrace all such modifications and variations.

What is claimed is:

1. A method for cleaning residue from a substrate upper surface, comprising:

exposing a region of substrate upper surface by removing a gate dielectric which overlies said substrate upper surface;

subsequent to a thermal process step:
immersing said substrate upper surface in a first solution comprising ammonium hydroxide heated to a temperature less than 65° C.; and
immersing said substrate upper surface in a second solution comprising hydrochloric acid heated to a temperature between 75° C. and 85° C.; and forming a tunnel oxide upon said substrate upper surface in areas void of said gate dielectric.

2. The method as recited in claim 1, wherein said forming step comprises growing said tunnel oxide in the presence of oxygen to a thickness less than said gate dielectric.

3. A method for forming a non-volatile memory, comprising:

forming a gate dielectric upon a semiconductor substrate;

selectively removing said gate dielectric to expose a tunnel oxide area upon said semiconductor substrate;

subsequent to a thermal process step, cleaning said tunnel oxide area in a first solution followed by a second solution, wherein said first solution comprises ammonium hydroxide heated to a temperature of approximately 65° C., and wherein said second solution comprises hydrochloric acid heated to a temperature between 75° C. and 85° C.;

forming a tunnel oxide in said tunnel oxide area to a thickness less than the thickness of said gate dielectric;

depositing a floating gate upon said tunnel oxide and adjacent said gate dielectric; and depositing a control gate a dielectrically spaced distance above said floating gate.

4. The method as recited in claim 3, wherein said selectively removing step comprises:

depositing a layer of organic photoresist upon said gate dielectric; and removing the organic photoresist and underlying gate dielectric over said tunnel oxide area.

5. The method as recited in claim 4, wherein said cleaning step comprises:

removing, during a first subcleaning step, the organic photoresist from the dielectric while simultaneously removing residual organic photoresist from said tunnel oxide area; and removing, during a second subcleaning step, inorganic and ionic contaminates resulting from the first subcleaning step from the tunnel oxide area.

6. The method as recited in claim 3, wherein said step of forming a tunnel oxide comprises growing a layer of silicon dioxide upon and within the tunnel oxide area.

7. The method as recited in claim 3, further comprising implanting a plurality of threshold adjust dopant ions and subsequently annealing said semiconductor substrate after the step of forming said gate dielectric and before the step of selectively removing said gate dielectric.

8. The method as recited in claim 7, wherein said annealing comprises subjecting said semiconductor substrate and said threshold adjust dopant ions to a temperature above 800° C.

9. A tunnel oxide area upper surface elevational disparity less than 5 angstroms, produced by the cleaning step of claim 3.

10. The method as recited in claim 3 wherein the step of forming said gate dielectric comprises:

subjecting said semiconductor substrate to an oxygen bearing ambient at a first temperature greater than 800° C. for a first duration; and purging said ambient of oxygen to form an oxygen depleted ambient and subjecting said semiconductor wafer to said oxygen depleted ambient at said first temperature for a second duration.

11. The method as recited in claim 3 wherein substantially none of said gate dielectric is removed during said cleaning step such that a thickness of said gate dielectric before said cleaning is substantially equal to a thickness of said gate dielectric after said cleaning whereby the step of forming said gate dielectric requires substantially no overgrowth.

\* \* \* \* \*